United States Patent
Sato et al.

(10) Patent No.: US 11,244,806 B2
(45) Date of Patent: Feb. 8, 2022

(54) CLEANING DEVICE

(71) Applicants: Hitachi High-Tech Corporation, Tokyo (JP); Hitachi High-Tech Canada, Inc., Toronto (CA)

(72) Inventors: Ryuju Sato, Tokyo (JP); David Hoyle, Toronto (CA)

(73) Assignees: Hitachi High-Tech Corporation, Tokyo (JP); Hitachi High-Tech Canada, Inc., Toronto (CA)

( * ) Notice: Subject to any disclaimer, the term of this patent is extended or adjusted under 35 U.S.C. 154(b) by 0 days.

(21) Appl. No.: 16/967,805

(22) PCT Filed: Feb. 7, 2018

(86) PCT No.: PCT/JP2018/004154
§ 371 (c)(1),
(2) Date: Aug. 6, 2020

(87) PCT Pub. No.: WO2019/155540
PCT Pub. Date: Aug. 15, 2019

(65) Prior Publication Data
US 2021/0043414 A1 Feb. 11, 2021

(51) Int. Cl.
*H01J 37/24* (2006.01)
*H01J 37/06* (2006.01)
(Continued)

(52) U.S. Cl.
CPC .......... *H01J 37/242* (2013.01); *H01J 37/06* (2013.01); *H01J 37/18* (2013.01); *H01J 37/244* (2013.01);
(Continued)

(58) Field of Classification Search
CPC .......... H01J 37/00; H01J 37/02; H01J 37/242; H01J 37/06; H01J 37/18; H01J 37/244;
(Continued)

(56) References Cited

U.S. PATENT DOCUMENTS

| 3,846,521 A | 11/1974 | Osterholtz |
| 8,736,170 B1 * | 5/2014 | Liu ........................ H01J 23/06 315/39.57 |

(Continued)

FOREIGN PATENT DOCUMENTS

| JP | 47-16574 A | 9/1972 |
| JP | 6-267492 A | 9/1994 |

(Continued)

OTHER PUBLICATIONS

International Search Report (PCT/ISA/210) issued in PCT Application No. PCT/JP2018/004154 dated May 1, 2018 with English translation (four (4) pages).

(Continued)

*Primary Examiner* — Jason L McCormack
(74) *Attorney, Agent, or Firm* — Crowell & Moring LLP

(57) ABSTRACT

A charged particle beam device includes a lens barrel having a charged particle source, a sample chamber in which a sample to be irradiated with a charged particle beam is provided, and a heat emission type electron source disposed in the sample chamber and maintained at a lower potential than that of an inner wall of the sample chamber, in which the inside of the sample chamber is cleaned by electrons (e–) emitted from the heat emission type electron source after a heating current is generated by applying a voltage from an electron source power supply. The heat emission type electron source is maintained at a lower potential than that of the inner wall of the sample chamber by applying a negative voltage to the heat emission type electron source using a bias power supply. A magnitude of the negative voltage applied to the heat emission type electron source is preferably about 30 to 1000 V, particularly preferably about 60 to 120 V.

21 Claims, 11 Drawing Sheets

(51) Int. Cl.
*H01J 37/18* (2006.01)
*H01J 37/244* (2006.01)
*H01J 37/28* (2006.01)

(52) U.S. Cl.
CPC ......... *H01J 37/28* (2013.01); *H01J 2237/022* (2013.01)

(58) Field of Classification Search
CPC .. H01J 37/28; H01J 37/16; H01J 37/20; H01J 37/3488; H01J 2237/022; H01J 1/22; A61L 2/007; A61L 2/087
USPC ............................ 250/306, 307, 311, 455.11
See application file for complete search history.

(56) References Cited

U.S. PATENT DOCUMENTS

| | | | |
|---|---|---|---|
| 9,248,207 B1 | 2/2016 | Heyoung | |
| 2006/0231772 A1* | 10/2006 | Jasinski | H01J 37/065 250/492.1 |
| 2006/0231773 A1* | 10/2006 | Katagiri | H01J 41/14 250/492.1 |
| 2013/0200788 A1* | 8/2013 | Cho | H01J 37/073 315/1 |
| 2014/0264019 A1* | 9/2014 | Adamec | H01J 3/027 250/310 |
| 2018/0170600 A1* | 6/2018 | Hostettler | B65B 55/08 |

FOREIGN PATENT DOCUMENTS

| | | |
|---|---|---|
| JP | 2000-149844 A | 5/2000 |
| JP | 2010-103072 A | 5/2010 |
| JP | 2012-99312 A | 5/2012 |
| JP | 2015-69734 A | 4/2015 |
| JP | 2016-54136 A | 4/2016 |
| WO | WO 2015/053300 A1 | 4/2015 |

OTHER PUBLICATIONS

Japanese-language Written Opinion (PCT/ISA/237) issued in PCT Application No. PCT/JP2018/004154 dated May 1, 2018 (five (5) pages).

Fourie J.T., "The Elimination Of Surface-Originating Contamination in Electron Microscopes", Optik, Nov. 14, 1978, pp. 421-426, vol. 52 (1978/1979), No. 5, (six (6) pages).

* cited by examiner

[FIG. 1]
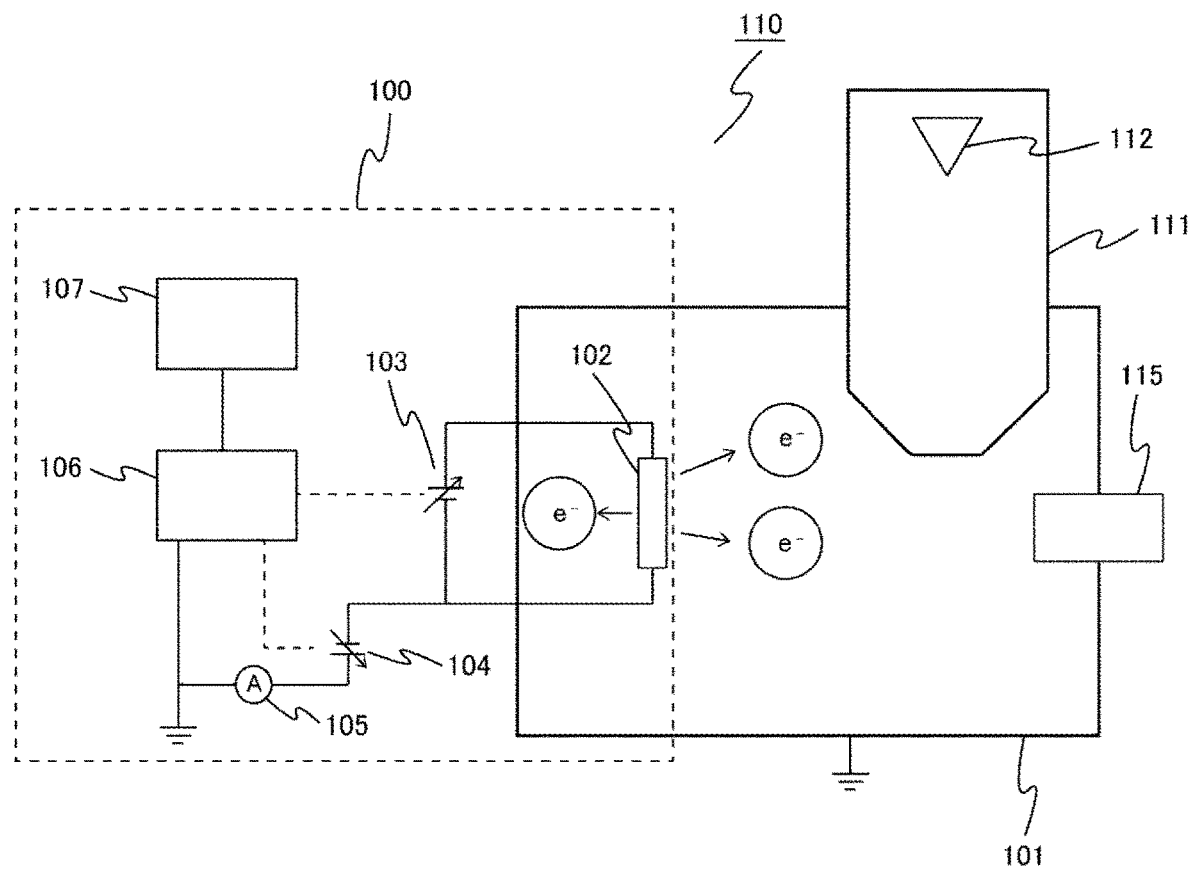

[FIG. 2]
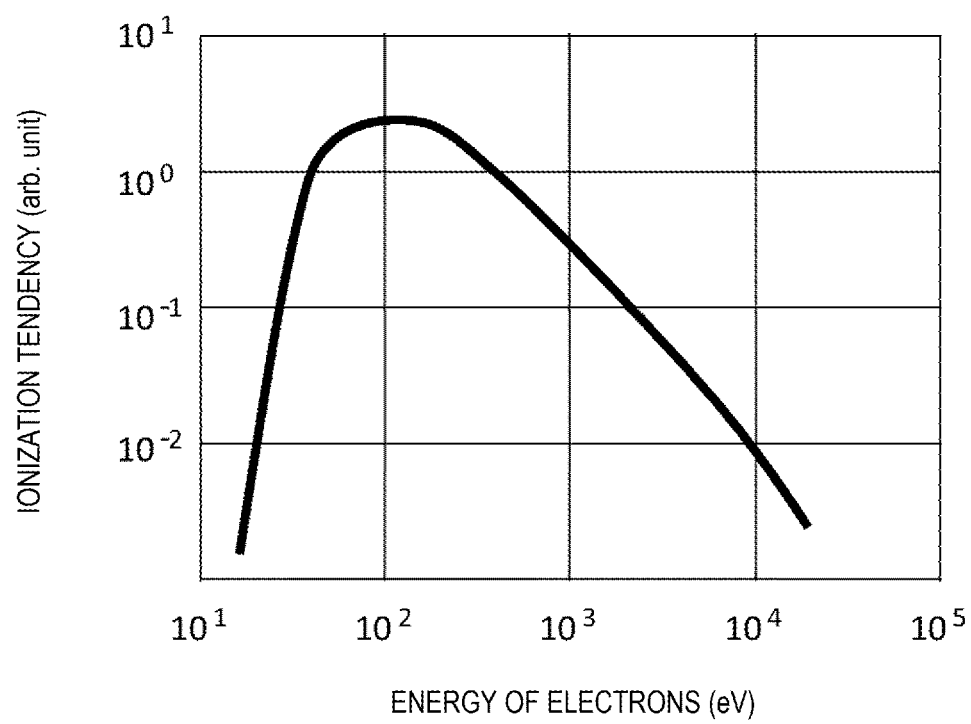

[FIG. 3]
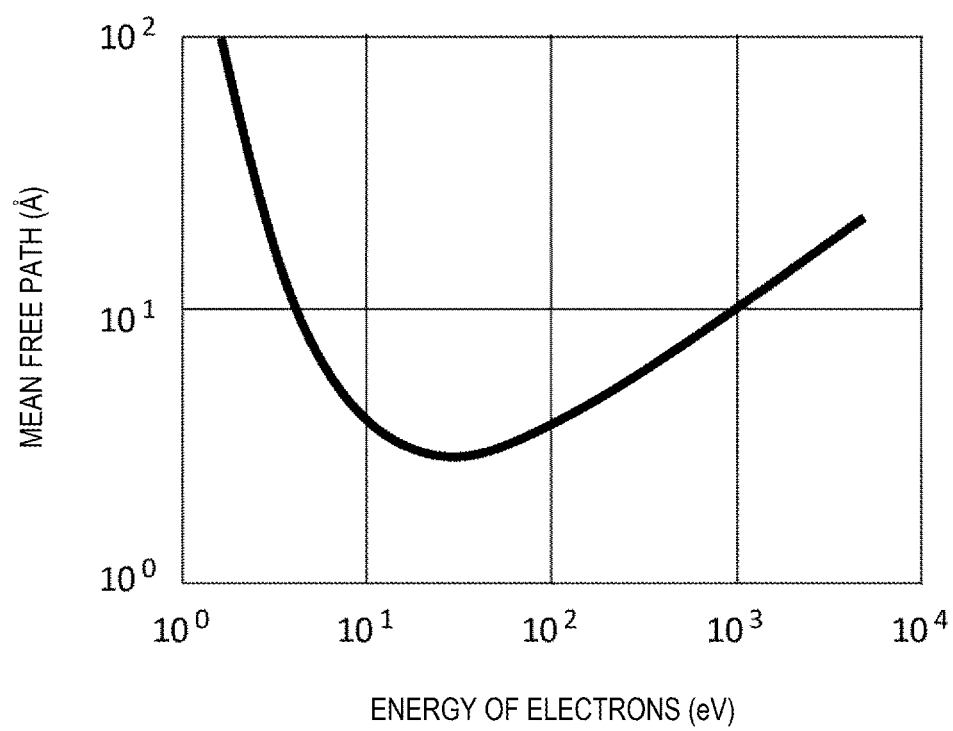

[FIG. 4]
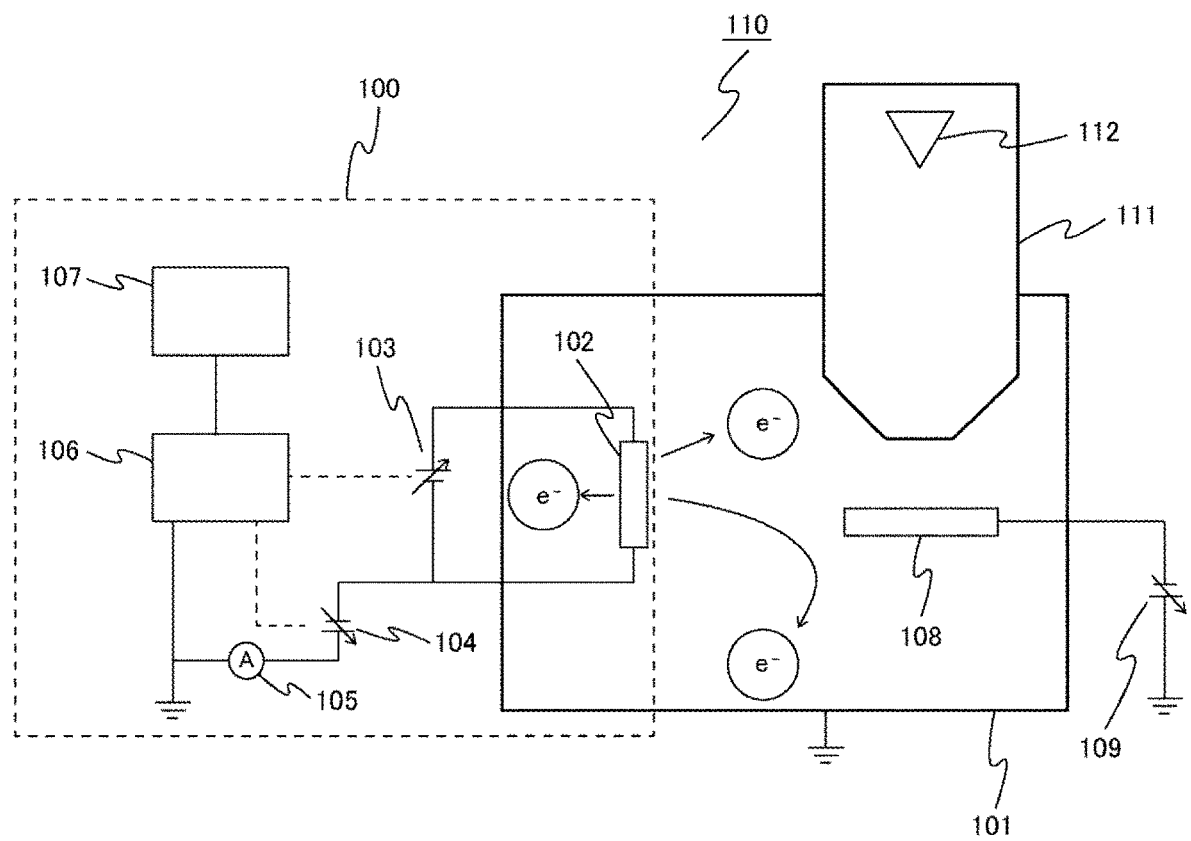

[FIG. 5]
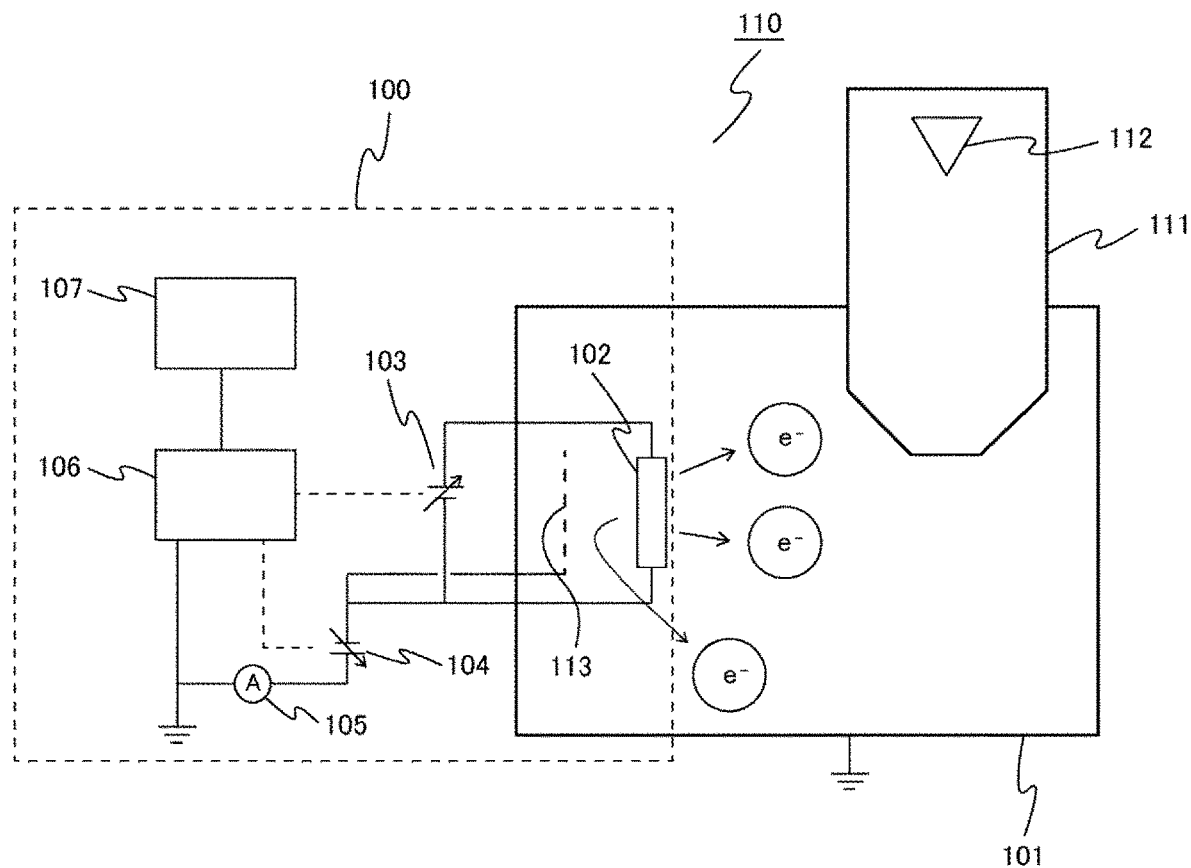

[FIG. 6]
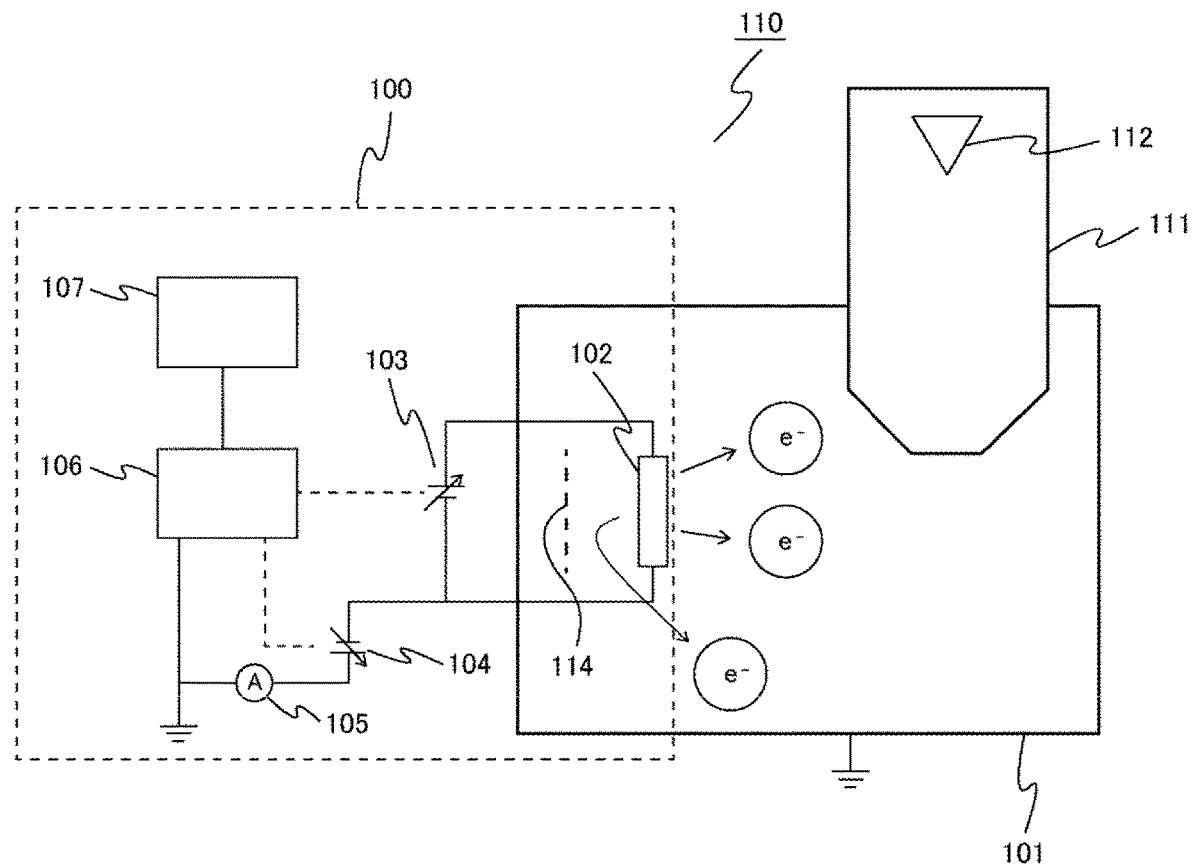
[FIG. 7]
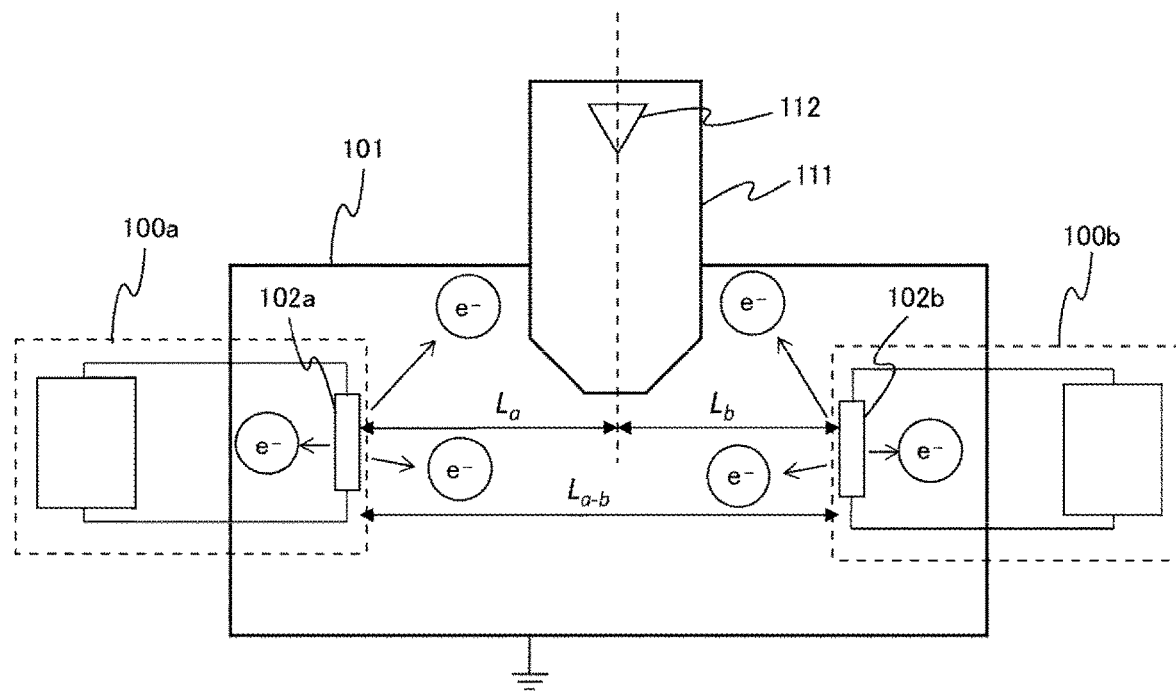

[FIG. 8]
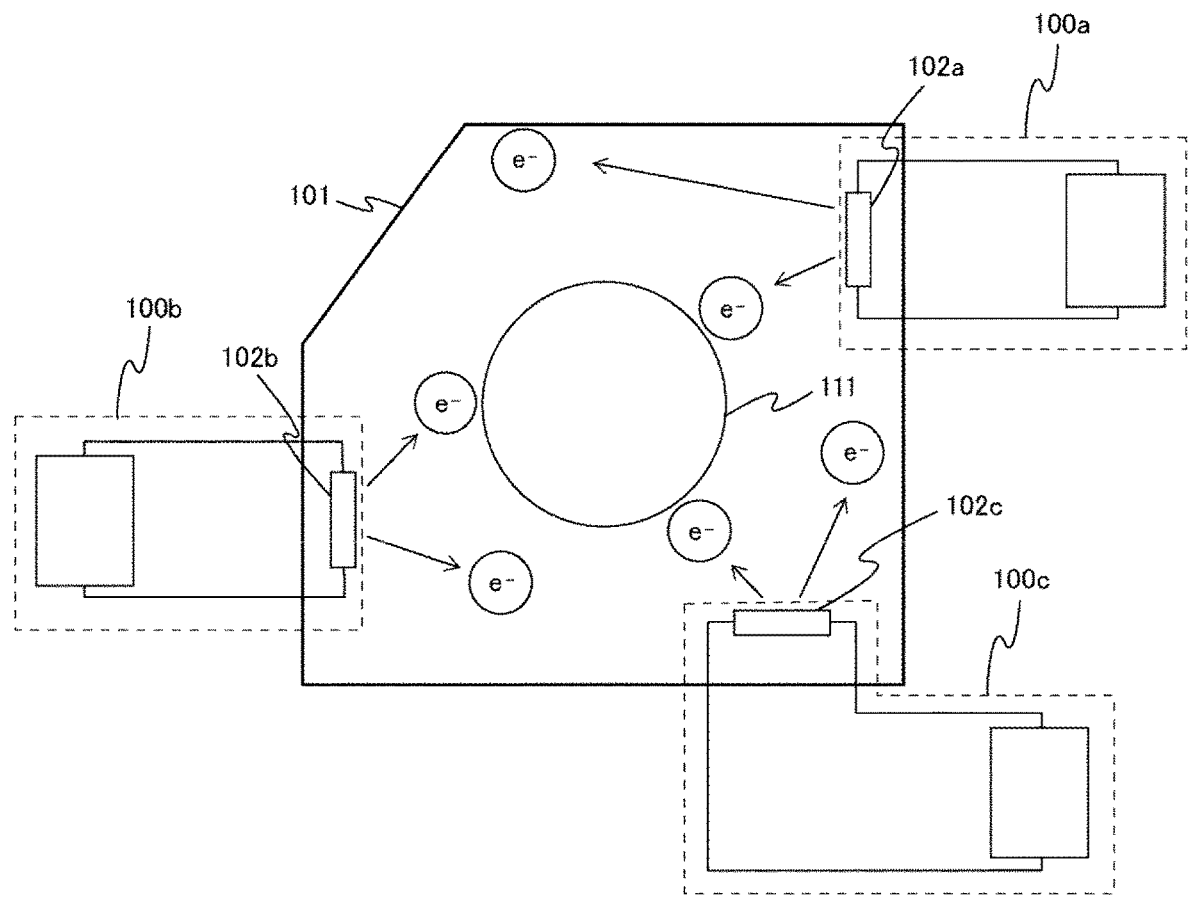

[FIG. 9]
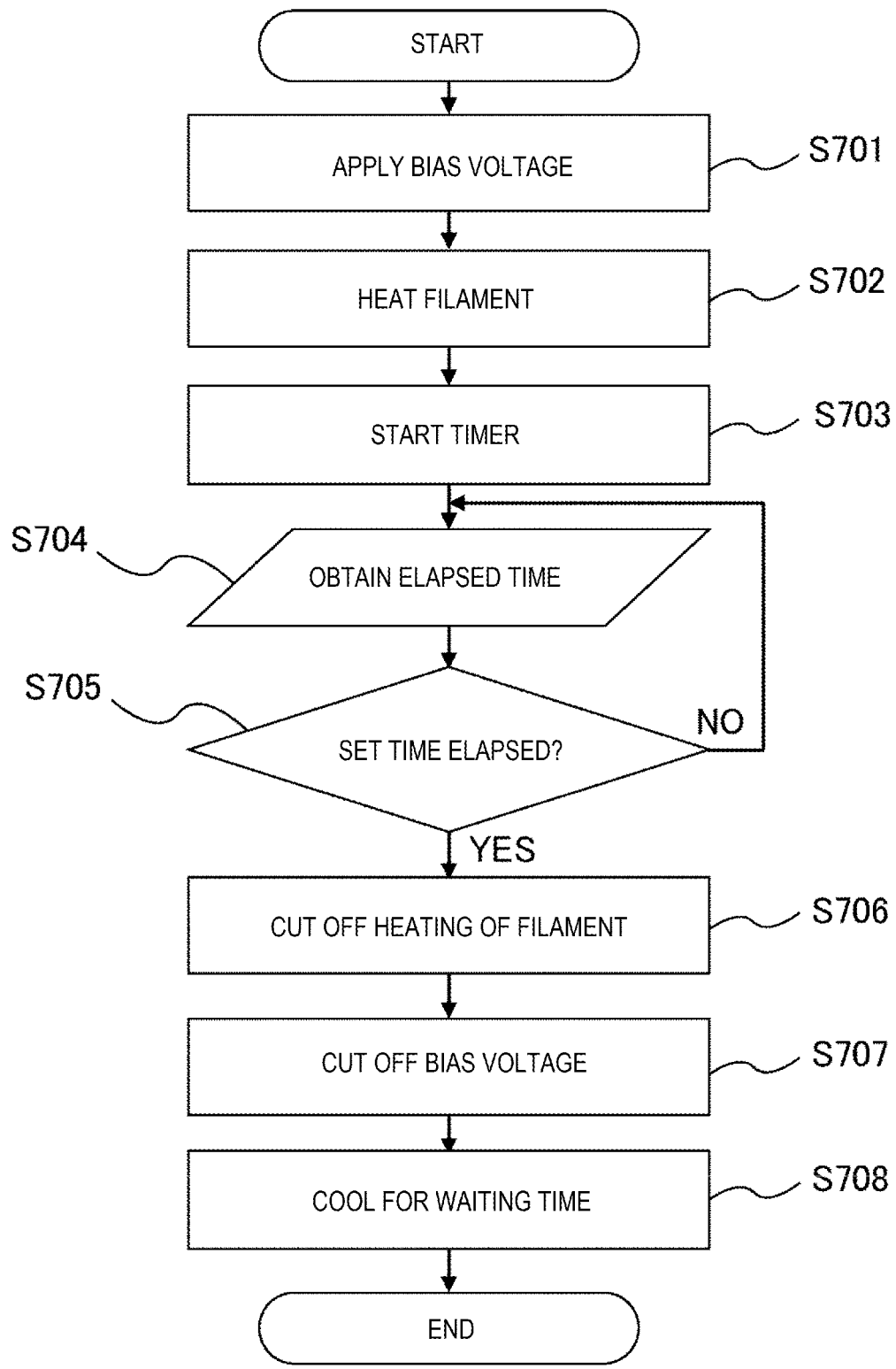

[FIG. 10]
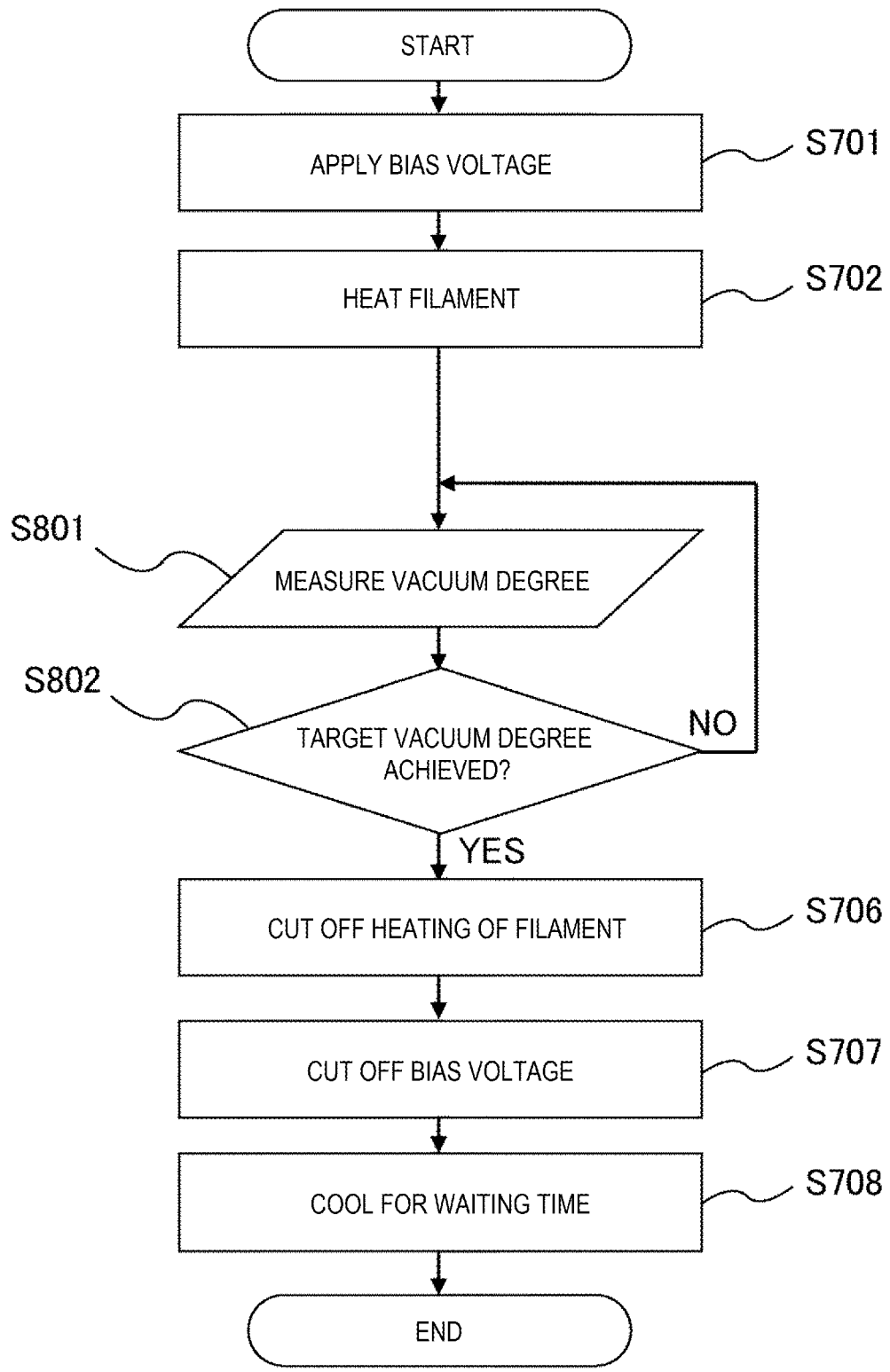

[FIG. 11]
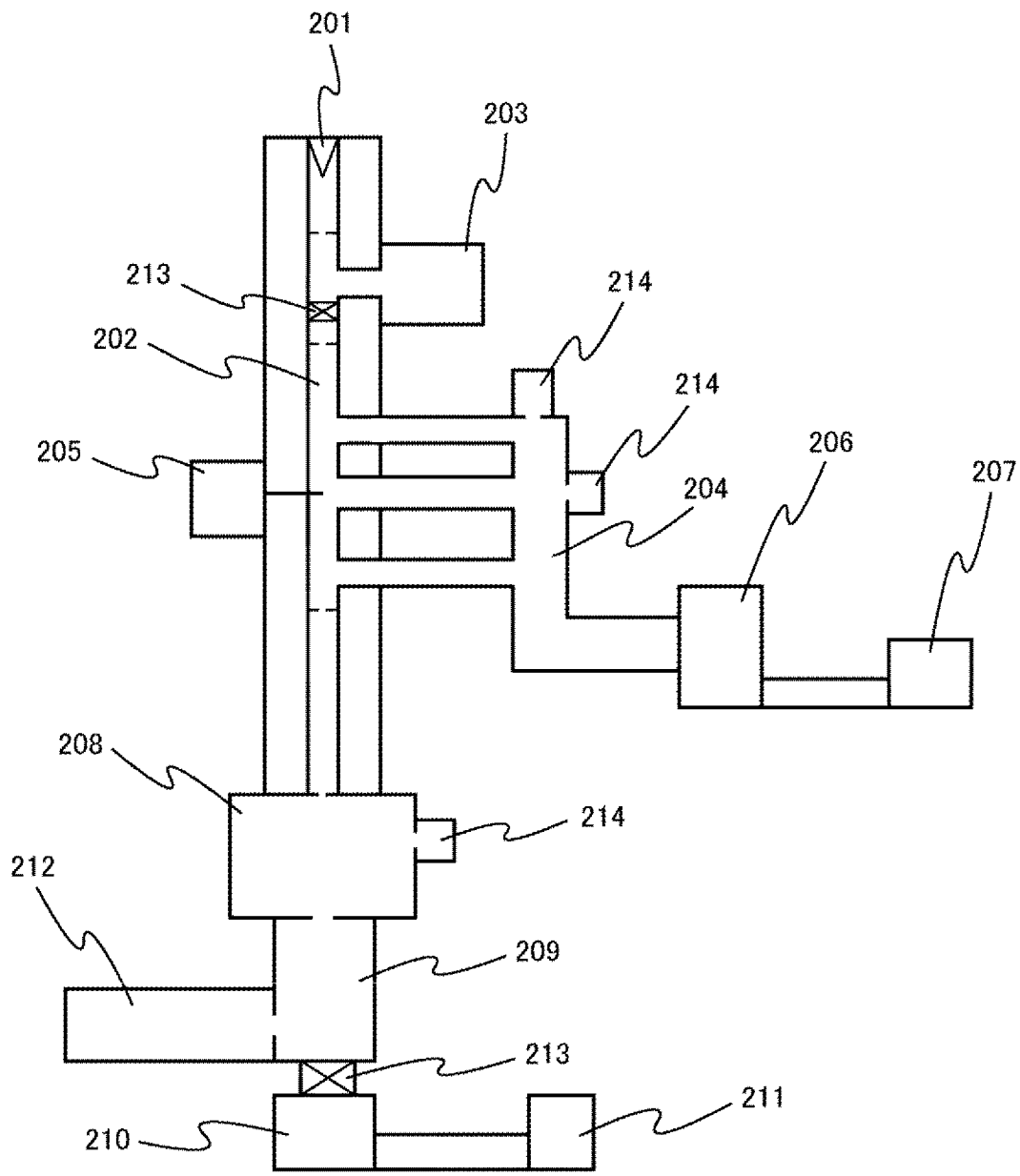

[FIG. 12]
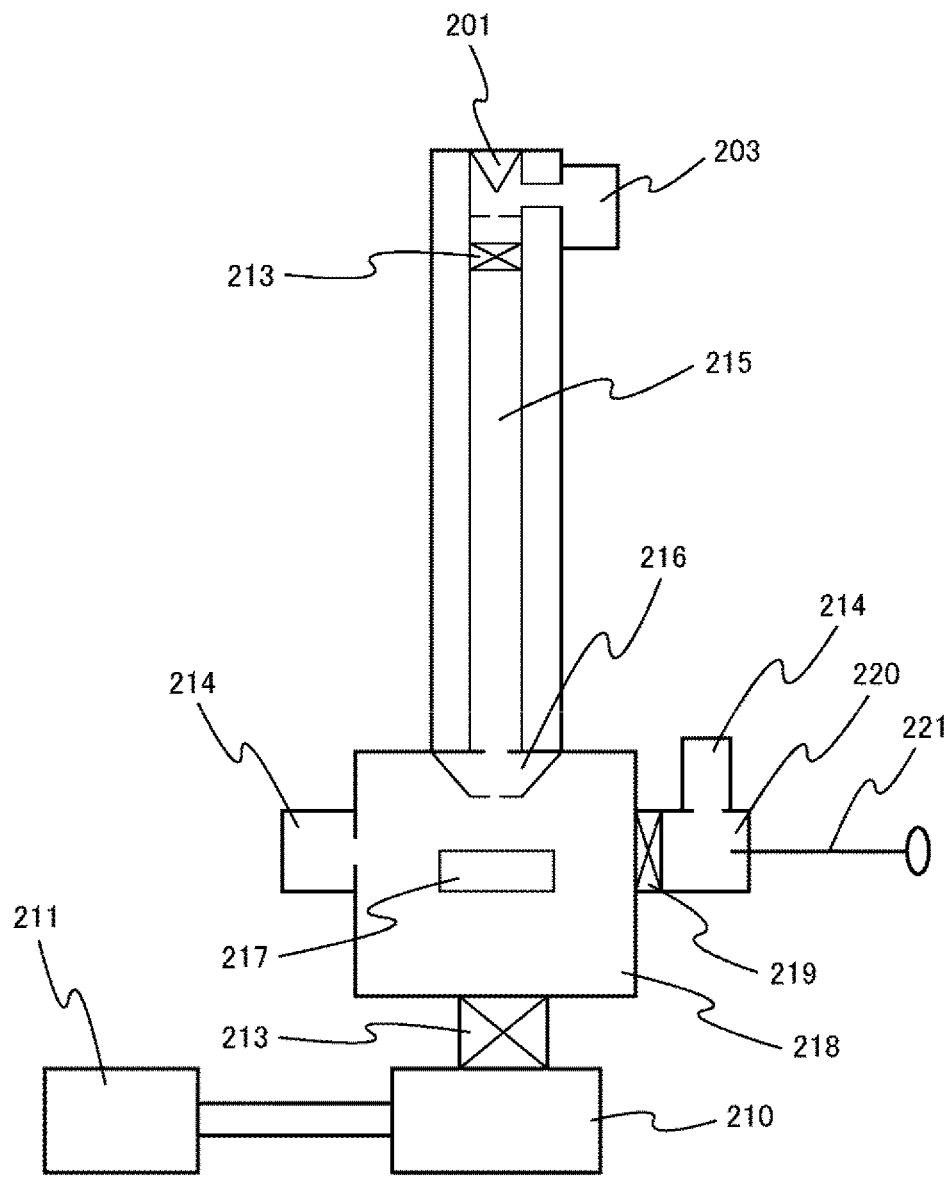

CLEANING DEVICE

TECHNICAL FIELD

The present invention relates to a charged particle beam device, and particularly to a cleaning technique of reducing an influence of contamination.

BACKGROUND ART

In a charged particle beam device typified by an electron microscope such as a transmission electron microscope (TEM/STEM) and a scanning electron microscope (SEM), contamination occurs when hydrocarbons and the like are deposited on an irradiation object such as a sample due to irradiation of a charged particle beam. When the contamination occurs, various problems occur, for example, an S/N ratio of an electron microscope image is deteriorated, a sample surface shape is changed, sample information is lost, and an observation and an analysis are difficult.

In order to reduce the influence of such contamination, as the related art, a method of heating a device body using radiant heat emitted from a light emitting source such as a heater (see PTL 1), a method of emitting ultraviolet light radiated from an excimer lamp (see PTL 2), and a method of generating plasma and using activated oxygen radicals and ions (see PTL 3) are known. On the other hand, a method of using a W filament to remove contamination on a sample surface to be observed using an electron microscope (see NPL 1) is known.

CITATION LIST

Patent Literature

PTL 1: JP-A-2010-103072
PTL 2: JP-A-2015-69734
PTL 3: JP-A-2016-54136

Non-Patent Literature

NPL 1: J. T. Fourie, "The elimination of surface-originating contamination in electron microscopes", Optik, 52(1978/79) No. 5, 421-426

SUMMARY OF INVENTION

Technical Problem

Many of the methods described above have a problem that it is difficult to maintain the inside of the device at an ultra-high vacuum due to an influence of outgas generated by heat or gas introduction during plasma generation. Further, it is difficult to apply the methods to the irradiation object such as a sample which is weak to the heat generated by heating or the emitted ultraviolet light. Further, NPL intends to remove the contamination on the sample surface to be observed before observation, and does not intend to remove contamination in a sample chamber.

An object of the invention is to solve the problems of such a charged particle beam device, and to provide a cleaning device capable of reducing an influence of contamination in a sample chamber and maintaining a high vacuum.

Solution to Problem

In order to achieve the above object, the invention provides a cleaning device including a lens barrel having a charged particle source, a sample chamber in which a sample to be irradiated with a charged particle beam from the charged particle source is provided, and a heat emission type electron source disposed in the sample chamber, in which the inside of the sample chamber is cleaned by electrons emitted from the heat emission type electron source.

Further, in order to achieve the above object, the invention provides a cleaning device including a lens barrel having a charged particle source, a sample chamber in which a sample to be irradiated with a charged particle beam from the charged particle source is provided, and an electron source disposed in the sample chamber and held at a negative potential with respect to the sample chamber, in which the inside of the sample chamber is cleaned by electrons emitted from the electron source.

Advantageous Effect

According to the invention, it is possible to provide a cleaning device capable of cleaning a sample chamber while maintaining the inside of the device at an ultra-high vacuum without complicating the device.

BRIEF DESCRIPTION OF DRAWINGS

FIG. 1 is a diagram showing an example of an overall configuration of a charged particle beam device including a cleaning device according to Embodiment 1.

FIG. 2 is a diagram showing dependence of ionization tendency on energy of emitted electrons.

FIG. 3 is a diagram showing dependence of a mean free path on the energy of the emitted electrons.

FIG. 4 is a diagram showing an example of an overall configuration of a charged particle beam device including a cleaning device according to Embodiment 2.

FIG. 5 is a diagram showing an example of a cleaning device using a heat emission type electron source including an active reflection electrode according to Embodiment 3.

FIG. 6 is a diagram showing an example of a cleaning device using a heat emission type electron source including an independent passive reflection electrode according to Embodiment 4.

FIG. 7 is a diagram showing an example in which a plurality of cleaning devices according to Embodiments 1 to 4 is disposed in a charged particle beam device.

FIG. 8 is a diagram showing an example in which a plurality of cleaning devices according to Embodiments 1 to 4 is disposed in a charged particle beam device, as viewed from above the charged particle beam device.

FIG. 9 is a diagram showing a processing flow of a cleaning device using a timer according to Embodiment 5.

FIG. 10 is a diagram showing a processing flow of a cleaning device that performs a vacuum degree reading method according to Embodiment 6.

FIG. 11 is a diagram showing an example of a schematic configuration of a TEM/STEM equipped with a cleaning device according to Embodiment 7.

FIG. 12 is a diagram showing an example of a schematic configuration of an SEM equipped with a cleaning device according to Embodiment 8.

DESCRIPTION OF EMBODIMENTS

Hereinafter, embodiments of the invention will be described with reference to the drawings. An electron beam in this specification is a general term for electrons generated from an electron source, and includes an electron flood in an unfocused state and an electron beam focused in a small range. The electrons in the electron flood or the electron beam are accelerated to desired energy in order to enhance an ability to separate and desorb gas molecules from a vacuum chamber and the like, and are used in a cleaning device. Further, the electron source includes, in addition to a heating electron source, that is, a heat emission type electron source, a field emission type electron source, a Schottky type electron source, a photo-excitation type electron source and the like.

Embodiment 1

Embodiment 1 is an embodiment of a charged particle beam device including a cleaning device. That is, an embodiment of the cleaning device includes a lens barrel having a charged particle source, a sample chamber in which a sample to be irradiated with a charged particle beam from the charged particle source is provided, and a heat emission type electron source disposed in the sample chamber, in which the inside of the sample chamber is cleaned by an electron beam emitted from the heat emission type electron source.

FIG. 1 is a diagram showing a schematic configuration of the charged particle beam device according to Embodiment 1. In the figure, a charged particle beam device 110 includes a lens barrel 111 having a charged particle beam source 112, a cleaning device 100, and a sample chamber 101 formed of a vacuum chamber. The sample chamber 101 is preferably at a ground potential as shown. The cleaning device 100 includes: a thermionic electron source 102 provided inside the sample chamber 101; an electron source power supply 103 configured to generate a current for heating the electron source 102 (hereinafter referred to as a heating current); a bias power supply 104 configured to apply a voltage to the electron source 102; an ammeter 105 configured to measure a current of electrons (e) emitted from the electron source 102 (hereinafter, emission current); a control unit 106 configured to control various components such as the bias power supply 104; and a storage unit 107 for storing control conditions of the control unit 106, a current amount and the like. As the control unit 106 and the storage unit 107, a central processing unit (CPU) capable of performing a desired function program, a personal computer (PC), and the like may be used. The heat emission type electron source includes not only an electron emission type electron source such as a filament which is directly heated, but also an electron emission type electron source which is indirectly heated, and an energy range of the electron source is 30 to 1000 eV and is adjustable for a system.

As the electron source 102, a filament or any other member which is the above-described heat emission type electron source can be selected. As the other member, for example, a field emission type electron source, a Schottky type electron source, a photo-excitation type electron source, and the like can be selected. However, in consideration of simplicity of a configuration and a required emission current amount, it is desirable to generate electrons by thermionic emission from the filament which is the thermal emission type electron source.

As a material of the filament, tungsten (W) or iridium (Ir) can be selected. Here, if the filament becomes too hot, the material of the filament evaporates and then adheres to the inside of the sample chamber 101, so that the inside of the sample chamber 101 may be contaminated. By selecting a material containing thorium oxide ($ThO_2$) such as thoriated tungsten as the material of the filament, a work function of the filament is reduced and an operation temperature of the filament is also reduced, so that a possibility of contamination due to the filament can be reduced.

Unlike the cleaning device in the related art, the cleaning device 100 of the present embodiment does not require gas introduction or heating during cleaning, and thus cleaning can be performed when the sample chamber 101 is maintained at an ultra-high vacuum of, for example, $1 \times 10^{-3}$ Pa or less. On the other hand, as described above, when a filament is used for the electron source 102, the cleaning device 100 operates even at a relatively low vacuum degree because the filament can operate at $1 \times 10^{-1}$ Pa.

The bias power supply 104 determines energy of the electrons emitted from the electron source 102. As described below, the voltage applied to the electron source 102 by the bias power supply 104 is preferably about 30 to 1000 V, and particularly preferably about 60 to 120 V.

The higher the cleaning efficiency, the shorter the cleaning time required. The cleaning efficiency of the cleaning device of the present embodiment increases as an amount of the electrons (hereinafter, emission current) emitted from the electron source 102 increases. The increase of the cleaning efficiency can be easily achieved by increasing the heating current of the electron source power supply 103 and further heating a filament when the filament is used as the heat emission type electron source 102.

On the other hand, from a viewpoint of reducing a capacity of the electron source power supply 103 and evaporation of the filament material described above, it is desirable to minimize filament heating. The cleaning efficiency varies depending on a capacity and cleanliness of the sample chamber 101 and a type of a charged particle beam device, but based on experimental results using a scanning electron microscope for example, it is found that a preferred environment for a sample observation can be created by cleaning with an emission current of 2 to 3 μA for about 10 hours, or with an emission current of 10 μA for about 2 hours.

High-precision control of the cleaning efficiency can be achieved by controlling the heating current of the electron source. The emission current varies under influences of the stability of a filament temperature and a vacuum degree in the sample chamber. By monitoring the change of the emission current and feeding-back the change to the heating current, stabilization of the cleaning efficiency can be achieved. In this case, the cleaning device 100 preferably includes: the ammeter 105 for monitoring the emission current; the control unit 106 for receiving an output of the ammeter 105; and the storage unit 107 for storing the control conditions and the like of the control unit 106. However, these components are not essential in terms of a principle of cleaning, and the cleaning device 100 may have a configuration without these components.

Further, it is considered that a progress of the cleaning of the sample chamber 101 can be read from the emission current monitored by the ammeter 105. As will be described later, the cleaning device according to the present embodiment achieves cleaning by generating gas molecules by electron beam irradiation and exhausting the gas molecules by a vacuum pump. Therefore, a pressure in the sample chamber decreases as the cleaning progresses. As described above, the emission current is influenced by the vacuum degree in the sample chamber. Therefore, the control unit 106 can grasp the cleanliness in the sample chamber by clarifying a relationship between the emission current and the vacuum degree. Further, by disposing a vacuum gauge 115 in the sample chamber and directly reading the vacuum degree in the sample chamber with the vacuum gauge 115, the cleanliness in the sample chamber can be similarly known without using the ammeter 105.

Accordingly, it is possible to confirm whether sufficient cleanliness in the sample chamber is obtained even during the cleaning, and the cleaning can be performed in a necessary and sufficient time.

Here, occurrence of contamination and a cleaning principle of the cleaning device of the present embodiment will be described. According to PTL 1, it is considered that contamination occurs when hydrocarbon molecules in a vacuum are attracted to a charged particle beam, and the hydrocarbon molecules and the charged particle beam are deposited on the sample. It is also known that the hydrocarbon molecules are adhered to a member inside the sample chamber, and the hydrocarbon molecules diffuse into the vacuum by irradiating the member with a part of the scattered electron beam. Therefore, it can be said that removal of the hydrocarbon molecules in the sample chamber is an effective method for reducing the occurrence of the contamination.

As described above, it is important to remove, from the sample chamber, the hydrocarbon molecules adhered to the member inside the sample chamber (hereinafter referred to as adhered molecules) before the irradiation with the charged particle beam. In order to remove the adhered molecules, it is necessary to apply some energy to the adhered molecules to desorb the adhered molecules, and to exhaust the adhered molecules from the sample chamber by the vacuum pump. In the cleaning device in the related art, adhered molecules are desorbed by heating a member or irradiating the member with ultraviolet light.

In contrast, the cleaning device according to the present embodiment exhausts the adhered molecules according to the following two principles. One principle is to ionize and desorb the adhered molecules by electron beam irradiation, and the other principle is to ionize water molecules and oxygen molecules in the vacuum by electron beam irradiation, and to etch the adhered molecules by the water molecules and the oxygen molecules. In each case, ionization tendency of the molecules influences the cleaning efficiency.

Here, ionization efficiency of the molecules depends on the energy of the emitted electrons. FIG. 2 is a diagram showing dependence of the ionization tendency on the energy of the emitted electrons. It can be seen that $C_2H_2$, which is a type of hydrocarbon, is most easily ionized when electrons have energy of about 60 to 120 eV. Further, other elements are easily ionized when electrons have energy of about 30 to 1000 eV.

On the other hand, in consideration of an interaction with the adhered molecules, the shorter the mean free path is, the higher the cleaning efficiency is. FIG. 3 is a diagram showing dependence of the mean free path on the energy of the emitted electrons. It can be seen that the mean free path of the electrons is the shortest when the electrons have energy of about 30 to 60 eV, though the mean free path varies depending on the irradiation object. Therefore, it is considered that the ionization efficiency is improved in the energy band. It is considered that the adhered molecules can be ionized when the electrons have energy of about 10 to 1000 eV even in other energy.

As described above, from a viewpoint of the ionization efficiency of the molecules and the mean free path of the electrons, the voltage applied to the electron source 102 by the bias power supply 104 of the cleaning device of the present embodiment is preferably about 30 to 1000 V, and particularly preferably about 60 to 120 V. In the actual experimental results, it is confirmed that an effective cleaning effect is obtained with energy of about 100 eV.

Embodiment 2

Embodiment 2 is an embodiment of a charged particle beam device including a cleaning device in which a negative voltage is applied to a sample stage in a sample chamber in addition to the configuration of Embodiment 1.

As described above, the cleaning device according to Embodiment 1 irradiates the sample chamber 101 with an electron beam of several μA. Therefore, when a sample that is inconvenient for electron beam irradiation is provided in the sample chamber, the sample may be adversely influenced. Here, an example of the sample that is inconvenient for the electron beam irradiation includes a sample containing an insulator or a sample containing a substance that is destroyed by the electron beam irradiation. For example, in a case of an electron microscope, which is an example of the charged particle beam device, when an electron beam is emitted on the sample containing the insulator, electric charges accumulate in the insulator part to generate an electric field, and an influence of distorting an observed image is considered.

Therefore, in the present embodiment, in order to prevent the above-described adverse influence from occurring, penetration of the electron beam into the vicinity of the sample is prevented by maintaining the sample stage on which the sample is placed at a negative potential higher than the energy of the electron beam.

FIG. 4 shows an example of an overall configuration of the cleaning device of the present embodiment. In addition to the configuration of Embodiment 1, a retarding power supply 109 for applying a negative voltage to a sample stage 108 is provided. For example, when the bias power supply 104 applies a voltage of −100 V to the electron source 102 with respect to the sample chamber 101 at the ground potential, energy of electrons in the vicinity of the sample chamber becomes about 100 eV. At this time, if a voltage of −150 V is applied to the sample stage 108 by the retarding power supply 109, the electron beam cannot reach the sample stage and a trajectory can be bent before reaching the sample. Therefore, the electron beam irradiation on the sample can be prevented.

A scanning electron microscope, which is an example of the charged particle beam device, may include a power supply for applying a negative voltage to the sample stage in order to achieve a high-resolution observation. In such a charged particle beam device, the sample can be protected from electron beam irradiation without a need to newly introduce the retarding power supply 109.

Embodiment 3

Embodiment 3 is an embodiment of a charged particle beam device which includes a cleaning device using an electron source including an active reflection electrode. In the present embodiment, as a method for performing cleaning more efficiently, as shown in FIG. 5, an active reflection electrode 113 is disposed on a back side of the electron source 102 in the vacuum chamber of the sample chamber. A voltage is applied to the active reflection electrode 113 so as to be a negative potential with respect to the sample chamber 101. In FIG. 5, an output from the bias power supply 104 is connected to the active reflection electrode 113 for a purpose of not increasing the power supply, but a separate power supply may be prepared.

The electrons emitted from the electron source 102 are basically uniformly emitted in all directions. However, when the electron source 102 is attached to one end of the sample chamber 101, for example, as shown in FIG. 5, a sample chamber wall surface far from the electron source 102 has a small solid angle that can be viewed from the electron source 102, so that an amount of electrons that can be reached also decreases. A purpose of the active reflection electrode 113 is to irradiate the sample chamber 101 with the electrons more efficiently by biasing an electron emission direction.

The trajectory of the electrons is bent from the active reflection electrode 113 toward the sample chamber side by an electric field formed by the active reflection electrode 113 maintained at a negative potential with respect to the sample chamber 101. Therefore, the cleaning can be performed more efficiently by disposing the active reflection electrode 113 on the back side of the electron source 102 in a direction in which the electrons are to be emitted. When a power supply connected to the active reflection electrode 113 is prepared separately from the bias power supply 105, more electrons can be emitted toward the sample chamber 101 by applying a voltage to the electron source 102 so as to have a negative potential.

Embodiment 4

Embodiment 4 is an embodiment of a charged particle beam device which includes a cleaning device using an electron source including an independent passive reflection electrode. As shown in FIG. 6, with a configuration in which the passive reflection electrode 114 is disposed on the back side of the electron source 102 in the vacuum chamber of the sample chamber, an effect similar to that of Embodiment 3 can be obtained. Here, the passive reflection electrode 114 is an electrode that is negatively charged by electron beam irradiation. For example, a metal which is electrically insulated from surroundings or an insulator which becomes negative potential by electron beam irradiation can be used.

In the case of the configuration shown in FIG. 6, when electrons start to be emitted from the electron source 102, a potential of the passive reflection electrode 114 is almost the same as the ground potential, so that the electrons from the electron source 102 are emitted uniformly in all directions. A part of the emitted electrons reach the passive reflection electrode 114 and cause a negative potential to accumulate. The negative potential continues to accumulate as long as the emitted electrons continue to reach the passive reflection electrode 114. When a certain value of the negative potential is reached, the electrons are bent due to an electric field between the passive reflection electrode 114 and the sample chamber 101, thus the electrons cannot reach the passive reflection electrode 114, and the accumulation of the negative potential stops.

In this state, a trajectory of the electrons continues to be bent toward the sample chamber while the passive reflection electrode 114 is maintained at a constant negative potential. Therefore, similarly to the active reflection electrode 113 of FIG. 5, the electron emission direction can be biased.

In the case of the passive reflection electrode 114 of the present embodiment, it is difficult to control the voltage so as to finely control the electron emission direction, but a function as a reflection electrode can be achieved more easily because there is no need for a new power supply or connection to a power supply.

The active reflection electrode 113 and the passive reflection electrode 114 are not essential structures for functioning of the cleaning device 100 because the purpose is only to improve the cleaning efficiency.

In the configuration of the cleaning device of each embodiment described above, the electrons emitted from the electron source 102 go straight unless a force is applied from an electric field or a magnetic field. Therefore, the sample chamber has a location that cannot be reached and appears to be a shadow as viewed from the electron source 102 due to a shield such as the lens barrel 111. In order to effectively clean the non-reachable area, it is effective to dispose the cleaning devices 100 at a plurality of locations.

Of course, if a purpose is to irradiate the non-reachable area with electrons, it is desirable that the cleaning device 100 is disposed as desired from different angles with respect to the shield. For example, as shown in FIG. 7, if an electron source 102a of a cleaning device 100a and an electron source 102b of a cleaning device 100b are disposed on the charged particle beam device 110 so as to face each other with the shield interposed therebetween, electrons can be efficiently emitted to non-reachable areas of each other.

Alternatively, the non-reachable areas can be complemented without interposing the shield. In an arrangement shown in FIG. 8, the cleaning device 100a, the cleaning device 100b, and a cleaning device 100c do not face each other with respect to the lens barrel 111, but respective non-reachable areas can be irradiated with electrons.

From the above, as a more general interpretation, as shown in FIG. 7, when a distance between a center axis (optical axis) of the lens barrel 111 and the electron source 102a is La, a distance between the center axis and the electron source 102b is Lb, and a distance between the electron source 102a and the electron source 102b is La−b, as long as La−b>La and La−b>Lb are satisfied in the arrangement, the efficiency of the electron irradiation to the non-reachable area is improved, and thus the cleaning efficiency can be improved.

Here, the lens barrel 111 is shown as an example of the shield. Alternatively, a structure in the charged particle beam device 110 such as a sample stage and a mechanism for moving the sample stage can be a shield. In order to complement non-reachable areas generated by a plurality of shields, it may be advantageous to dispose more than two cleaning devices 100.

Further, in a case where the plurality of cleaning devices 100 are grounded without considering the shields and the non-reachable areas, a plurality of electron sources 102 is disposed in the sample chamber 101, so that even though a failure occurs in one filament, the cleaning can be continued without opening to the atmosphere.

Embodiment 5

Since the cleaning device 100 of Embodiments 1 to 4 described above has a timer function, a more gentle usage method for a user can be provided. Embodiment 5 is an embodiment of a timer-type cleaning device. That is, in the embodiment, a control unit performs control such that a bias voltage is applied by a bias power supply, then a heating current is supplied to a heat emission type electron source, and after a set time of a timer elapses, the heating current is stopped and the bias voltage is stopped. By the timer method of the present embodiment, for example, if the cleaning device 100 is set to operate at night when the charged particle beam device 110 is not used and to stop in the morning, the user does not need to stop the cleaning device.

FIG. 9 shows an operation flowchart of the cleaning device of the present embodiment using the timer. In the present embodiment, an operation flow assuming that a tungsten filament is used as the electron source 102 having the configuration of Embodiments 1 to 4 is described. Alternatively, as described above, any member can be used as an electron source. Further, in the following description, numerical values of the bias voltage and the heating current are described as an example, but it is not necessary to operate an actual device with these numerical values.

First, the user sets a cleaning time in advance. Thereafter, when the cleaning device 100 is started under the control of the control unit 106, first, a bias voltage of −100 V is applied to the filament (S701). Thereafter, a heating current of 1 A is supplied to the filament (S702). After an emission current is confirmed, the timer is started, and an elapsed time is obtained (S703, S704).

Here, the bias voltage is a fixed value, but the heating current is fed back from a change of the emission current. Since emission does not occur unless the filament is heated, the control unit 106 first supplies the heating current of 1 A as an initial value, and switches to feedback control when electron emission starts. For example, if a desired emission current is 2 mA and an emission current measured when the heating current is 1 A is 3 mA, the control unit 106 performs control such as reducing the heating current to 0.9 A.

When the control unit 106 recognizes that the time set in advance has elapsed (S705), the control unit 106 cuts off the heating current and the bias voltage in this order (S706, S707). Finally, in order to cool the filament, processing waits for 30 minutes (S708).

If the filament is exposed to the atmosphere in a heated state, oxidation may proceed and the filament may be damaged. By notifying the user of a waiting time, it is possible to notify that the sample chamber 101 is in a state where the sample chamber 101 cannot be opened to the atmosphere. Further, the opening to the atmosphere can be locked during the heating and the cooling of the filament by acting on the charged particle beam device side.

In order to implement the above procedure, the cleaning device 100 needs to include a control unit for controlling a power supply, an input unit for setting an operation time, and a monitor for displaying a remaining time. It is needless to say that the cleaning device 100 can be easily configured by using the above-described CPU and PC. However, these components are not essential structures for functioning of the invention.

Here, a purpose of applying the bias voltage before the heating of the filament is to reduce a risk of overheating of the filament. If the filament has a variation in wire diameter, a temperature varies even if the same heating current is supplied, but the temperature of the filament can be managed by controlling the emission current to be constant.

However, if the filament is heated before the bias voltage is applied, electrons are not emitted until the bias voltage is applied, so that the filament may not be overheated. The overheating of the filament causes damage to the filament and evaporation of tungsten from the filament. These risks can be reduced by operating the cleaning device 100 according to the procedure of the present embodiment described in FIG. 9. Further, in an end sequence of cleaning, the heating current is cut off before cutting off the bias voltage for the same purpose.

Here, in order to prevent the filament from being overheated, it is sufficient that the heating current can be accurately controlled below a target value of the emission current at which the temperature of the filament becomes high. Therefore, it is not necessary to apply the bias voltage in advance in a heating current value range where it is clear that the temperature of the filament is low.

For example, a method may be used in which only a little heating current is supplied before the bias voltage is applied, and the heating current is increased to a target value after the bias voltage is applied. Further, when the cleaning is completed, a procedure in which the heating current is reduced, then the bias voltage is cut off, and the heating current is cut off may be used.

Embodiment 6

As described above, it can be predicted whether sufficient cleanliness has been achieved in the sample chamber during cleaning by reading a vacuum degree. As Embodiment 6, an embodiment of a vacuum degree reading method for determining an operation time of the cleaning device 100 based on the vacuum degree will be described. The present embodiment is an embodiment in which a control unit performs control such that a bias voltage is applied by a bias power supply, then a heating current is supplied to a heat emission type electron source, the vacuum degree in the sample chamber is measured, and when a target vacuum degree is achieved, the heating current is stopped and the bias voltage is stopped.

FIG. 10 shows a flowchart of the present embodiment. In the figure, the user first inputs the target vacuum degree in advance. Thereafter, under the control of the control unit 106, the bias voltage and the heating current are operated in this order (S701, S702). During the cleaning, the vacuum degree in the sample chamber is measured by the method described above (S801). If the vacuum degree falls below the target vacuum degree set in advance (S802), the heating current and the bias voltage are cut off in this order, and the cleaning is completed (S706, S707). Thereafter, processing waits for a cooling time of the filament (S708).

In order to implement the above procedure, similarly to Embodiment 5, the cleaning device 100 of the present embodiment needs to include a control unit for controlling a power supply, an input unit for setting the target vacuum degree, and a vacuum gauge for measuring the vacuum degree. However, these components are not essential structures for the functioning of the invention.

Embodiment 7

Embodiment 7 is an embodiment of a TEM or an STEM equipped with the cleaning device according to each of the above-described embodiments. FIG. 11 is a diagram showing an overall configuration of the TEM or the STEM including a cleaning device of the present embodiment.

In the figure, an electron beam emitted from an electron gun 201 passes through an electron column 202, passes through a sample on a sample stage 205, is projected as a sample image in a projection chamber 208, and is photographed by a camera in a camera chamber 209. As described in Embodiments 1 and 2, cleaning devices 214 are disposed on the electron column 202 in the vicinity of the sample stage 205 via a vacuum exhaust pipe 204. In the figure, 203 denotes an ion pump, 206 and 210 denote high vacuum pumps, 207 and 211 denote roughing pumps, 212 denotes a spectrometer, and 213 denotes a vacuum valve. According to the present embodiment, the sample stage can be cleaned by the cleaning devices 214 while maintaining an ultra-high vacuum inside the TEM or the STEM device.

Embodiment 8

Embodiment 8 is an embodiment of an SEM equipped with the cleaning device of each embodiment described above. FIG. 12 is a diagram showing an overall configuration of the SEM including a cleaning device of the present embodiment.

In the figure, an electron beam emitted from the electron gun 201 passes through a vacuum column 215 and scans, via a lens 216, a sample surface of a sample stage 217 of a vacuum chamber 218 constituting a sample chamber. Then, an SEM image is generated by detecting secondary electrons and the like from a sample. The cleaning devices 214 are disposed on the vacuum chamber 218, which is the sample chamber, and also on a sample load lock 220 as in Embodiments 1 and 2. In this configuration, the sample surface can be cleaned by the cleaning devices 214 attached to the sample load lock 220. The vacuum chamber 218 and the sample surface are preferably at the ground potential when the vacuum chamber 218 and the sample surface are cleaned. In the figure, 203 denotes an ion pump, 206 and 210 denote high vacuum pumps, 207 and 211 denote roughing pumps, 219 denotes a sample valve between the vacuum chamber 218 and the sample load lock 220, and 221 denotes a sample rod. According to the present embodiment, the sample chamber and the sample can be cleaned while maintaining an ultra-high vacuum inside the SEM device.

The invention is not limited to the above embodiments, and includes various modifications. The TEM/STEM and the SEM have been described as examples of the charged particle beam device to which the cleaning device of the invention is applied. Alternatively, needless to say, the cleaning device may be applied to another charged particle beam device, such as a CDSEM, an FIB, and a dual beam FIB, to reduce a hydrocarbon amount in the device. Further, the cleaning device can be used as a cleaning system even in a medium to ultra-high vacuum device of about $1 \times 10^{-1}$ Pa to $1 \times 10^{-12}$ Pa requiring a low hydrocarbon amount. At the same time, if the cleaning system is properly adjusted, the cleaning system can also be applied to cleaning of a sample or cleaning of a sufficiently vacuum-exhausted sample port.

Further, the embodiments described above are described in detail for better understanding of the invention, and are not necessarily limited to the embodiments that include all the configurations described above. Further, a part of the configuration of one embodiment can be replaced with the configuration of another embodiment, and the configuration of another embodiment can be added to the configuration of the one embodiment. Further, a part of the configuration of each embodiment can be added to another configuration, omitted, or replaced with another configuration. For example, in each above embodiment, although an example in which only one electron source is disposed has been described, a plurality of electron sources of the same type or different types may be disposed. That is, if a plurality of filaments is used in parallel, flux can be increased, and even when a failure occurs in one filament, cleaning can be continued without opening to the atmosphere by using two or more filaments simultaneously but independently. Further, a plurality of different types of electron sources can be provided and used in a wide range of vacuum degree.

Further, an example of using a program of a CPU and a PC for performing a part or all of functions of the above-described configurations, functions, and control units, and the like is described, and it is needless to say that a part or all of the configurations, functions, and control units may be implemented with hardware, by for example, designing an integrated circuit. That is, all or a part of the functions of the control units may be implemented by the integrated circuit such as an application specific integrated circuit (ASIC) or a field programmable gate array (FPGA) instead of the program.

In the above detailed description of the invention, various inventions other than the inventions described in claims are included, and some of the inventions are listed as follows.

<List 1>

A cleaning device including:

a lens barrel having a charged particle source;

a sample chamber in which a sample to be irradiated with a charged particle beam from the charged particle source is provided;

a first electron source disposed in the sample chamber and held at a negative potential with respect to the sample chamber; and a detector configured to detect a current flowing through the first electron source, in which the sample chamber is cleaned by irradiation with an electron beam from the first electron source.

<List 2>

The cleaning device according to list 1, further including:

a control unit configured to receive an output of the detector, in which the control unit is configured to calculate cleanliness in the sample chamber based on the output of the detector.

<List 3>

The cleaning device according to list 1, in which a current is supplied to the first electron source in a state where a voltage applied to a sample stage in the sample chamber is lower than a voltage applied to an inner wall of the sample chamber.

<List 4>

The cleaning device according to list 1, further including:

a vacuum gauge configured to detect a vacuum degree in the sample chamber.

<List 5>

The cleaning device according to list 1, in which a current is supplied to the first electron source in a state where a voltage applied to a sample stage disposed in the sample chamber is lower than a voltage applied to an inner wall of the sample chamber.

<List 6>

The cleaning device according to list 1, in which the first electron source includes an active reflection electrode or a passive reflection electrode.

<List 7>

The cleaning device according to list 1, in which the lens barrel and the sample chamber are a lens barrel and a sample chamber of an electron microscope.

<List 8>

The cleaning device according to list 1, further including:

a bias power supply configured to apply a bias voltage to the first electron source.

<List 9>

The cleaning device according to list 8, further including:

a unit configured to apply, to a sample stage, a voltage lower than a bias voltage applied to the first electron source.

<List 10>

The cleaning device according to list 8, further including:

an electron source power supply configured to supply a heating current to the first electron source, in which the bias power supply is configured to apply a bias voltage to the first electron source before the electron source power supply supplies a heating current to the first electron source.

<List 11>

The cleaning device according to list 8, further including: an electron source power supply configured to supply a heating current to the first electron source, in which the bias power supply is configured to stop applying the bias voltage to the first electron source after the electron source power supply stops supplying the heating current to the first electron source.

<List 12>

The cleaning device according to list 8, in which the bias power supply is configured to apply a voltage of 30 to 1000 V to the first electron source.

<List 13>

The cleaning device according to list 8, in which the bias power supply is configured to apply a voltage of 60 to 120 V to the first electron source.

<List 14>

The cleaning device according to list 1, further including: a second electron source disposed in the sample chamber.

<List 15>

The cleaning device according to list 14, in which both a distance between an optical axis of the lens barrel and the first electron source and a distance between the optical axis and the second electron source are shorter than a distance between the first electron source and the second electron source.

<List 16>

The cleaning device according to list 14, in which the first electron source and the second electron source are disposed at a position where the first electron source and the second electron source sandwich a part of the lens barrel in the sample chamber or a sample stage disposed in the sample chamber.

<List 17>

The cleaning device according to list 14, further including:

a third electron source disposed in the sample chamber.

<List 18>

A cleaning device including:

a sample chamber in which a sample to be irradiated with a charged particle beam from a charged particle source is provided;

a heat emission type electron source disposed in the sample chamber;

an electron source power supply configured to supply a heating current to the heat emission type electron source;

a bias power supply configured to hold the heat emission type electron source at a negative potential with respect to the sample chamber;

a detector configured to detect a current emitted from the heat emission type electron source; and a control unit configured to receive an output of the detector and control the electron source power supply and the bias power supply, in which the sample chamber is cleaned by electrons emitted from the heat emission type electron source.

<List 19>

The cleaning device according to list 18, in which the control unit is configured to control, based on the output of the detector, the heating current flowing from the electron source power supply to the heat emission type electron source.

<List 20>

The cleaning device according to list 18, in which the control unit is configured to control such that a bias voltage is applied by the bias power supply, then the heating current is supplied to the heat emission type electron source, and after a set time elapses, the heating current is stopped and the bias voltage is stopped.

<List 21>

The cleaning device according to list 18, in which the control unit is configured to control such that a bias voltage is applied by the bias power supply, then the heating current is supplied to the heat emission type electron source, a vacuum degree in the sample chamber is measured, and when a target vacuum degree is achieved, the heating current is stopped and the bias voltage is stopped.

<List 22>

The cleaning device according to list 18, in which the control unit is configured to measure a vacuum degree in the sample chamber based on the output of the detector.

REFERENCE SIGN LIST

100: cleaning device
101: sample chamber
102: electron beam source
103: electron source power supply
104: bias power supply
105: ammeter
106: control unit
107: storage unit
108: sample stage
109: retarding voltage
110: charged particle beam device
111: lens barrel
112: charged particle beam source
113: active reflection electrode
114: passive reflection electrode
115: vacuum gauge
201: electron gun
202: electron column
203: ion pump
204: vacuum exhaust pipe
205, 217: sample stage
206, 210: high vacuum pump
207, 211: roughing pump
208: projection chamber
209: camera chamber
212: spectrometer
213: vacuum valve
214: cleaning device
215: vacuum column
216: lens
217: stage
218: vacuum chamber
219: sample valve
220: sample load lock
221: sample rod

The invention claimed is:

1. A cleaning device comprising:
a first heat emission type electron source disposed in a sample chamber connected to a lens barrel having a charged particle source, wherein
the sample chamber is cleaned by electrons emitted from the first heat emission type electron source, and
a current is supplied to the first heat emission type electron source in a state where a voltage applied to a sample stage disposed in the sample chamber is lower than a voltage applied to an inner wall of the sample chamber.

2. The cleaning device according to claim 1, wherein the first heat emission type electron source is a filament.

3. The cleaning device according to claim 2, wherein the filament is a tungsten filament.

4. The cleaning device according to claim 1, further comprising:
an electron source power supply configured to supply a heating current to the first heat emission type electron source.

5. The cleaning device according to claim 4, further comprising:
a detector configured to detect a current flowing through the first heat emission type electron source.

6. The cleaning device according to claim 5, further comprising:
a control unit configured to receive an output of the detector, wherein
the control unit is configured to output cleanliness in the sample chamber based on the output of the detector.

7. The cleaning device according to claim 5, further comprising:
a control unit configured to receive an output of the detector, wherein
the control unit is configured to control, based on the output of the detector, the heating current flowing from the electron source power supply to the first heat emission type electron source.

8. The cleaning device according to claim 1, further comprising:
a vacuum gauge configured to detect a vacuum degree in the sample chamber.

9. A cleaning device comprising:
a first heat emission type electron source disposed in a sample chamber connected to a lens barrel having a charged particle source, wherein
the sample chamber is cleaned by electrons emitted from the first heat emission type electron source, and
the first heat emission type electron source includes an active reflection electrode or a passive reflection electrode.

10. The cleaning device according to claim 1, wherein the lens barrel and the sample chamber are a lens barrel and a sample chamber of an electron microscope.

11. The cleaning device according to claim 1, further comprising:
a bias power supply configured to apply a bias voltage to the first heat emission type electron source.

12. The cleaning device according to claim 11, further comprising:
a unit configured to apply, to a sample stage, a voltage lower than the bias voltage applied to the first heat emission type electron source.

13. The cleaning device according to claim 11, further comprising:
an electron source power supply configured to supply a heating current to the first heat emission type electron source, wherein
the bias power supply is configured to apply a bias voltage to the first heat emission type electron source before the electron source power supply supplies the heating current to the first heat emission type electron source.

14. The cleaning device according to claim 11, further comprising:
an electron source power supply configured to supply a heating current to the first heat emission type electron source, wherein
the bias power supply is configured to stop applying the bias voltage to the first heat emission type electron source after the electron source power supply stops supplying the heating current to the first heat emission type electron source.

15. The cleaning device according to claim 11, wherein the bias power supply is configured to apply a voltage of 60 to 120 V to the first heat emission type electron source.

16. The cleaning device according to claim 1, further comprising:
a second heat emission type electron source disposed in the sample chamber.

17. The cleaning device according to claim 16, wherein both a distance between an optical axis of the lens barrel and the first heat emission type electron source and a distance between the optical axis and the second heat emission type electron source are shorter than a distance between the first heat emission type electron source and the second heat emission type electron source.

18. The cleaning device according to claim 16, wherein the first heat emission type electron source and the second heat emission type electron source are disposed at a position where the first heat emission type electron source and the second heat emission type electron source sandwich a part of the lens barrel in the sample chamber or a sample stage disposed in the sample chamber.

19. The cleaning device according to claim 16, further comprising:
a third heat emission type electron source disposed in the sample chamber.

20. A cleaning device comprising:
an electron source which is disposed in a sample chamber connected to a lens barrel having a charged particle source and is held at a negative potential with respect to the sample chamber,
wherein a current is supplied to the first heat emission type electron source in a state where a voltage applied to a sample stage disposed in the sample chamber is lower than a voltage applied to an inner wall of the sample chamber.

21. The cleaning device according to claim 20, wherein the sample chamber is cleaned by irradiation of electrons from the electron source.

* * * * *